United States Patent
Epperson et al.

(10) Patent No.: US 10,209,271 B2
(45) Date of Patent: Feb. 19, 2019

(54) HANDHELD MEASUREMENT SYSTEM WITH SELECTABLE OPTIONS

(71) Applicant: Fluke Corporation, Everett, WA (US)

(72) Inventors: David Lawrence Epperson, Everett, WA (US); Glen Howard Vetter, Stanwood, WA (US); Joseph V. Ferrante, Redmond, WA (US)

(73) Assignee: Fluke Corporation, Everett, WA (US)

(*) Notice: Subject to any disclaimer, the term of this patent is extended or adjusted under 35 U.S.C. 154(b) by 205 days.

(21) Appl. No.: 15/193,887

(22) Filed: Jun. 27, 2016

(65) Prior Publication Data

US 2016/0305978 A1 Oct. 20, 2016

Related U.S. Application Data

(63) Continuation of application No. 13/844,407, filed on Mar. 15, 2013, now Pat. No. 9,377,485.

(51) Int. Cl.
| | | |
|---|---|---|
| *G06F 3/048* | (2013.01) | |
| *G01R 1/02* | (2006.01) | |
| *G06F 3/0488* | (2013.01) | |
| *G01R 15/12* | (2006.01) | |
| *G06F 3/0482* | (2013.01) | |

(Continued)

(52) U.S. Cl.
CPC .......... *G01R 1/025* (2013.01); *G01R 15/125* (2013.01); *G06F 3/0482* (2013.01); *G06F 3/0488* (2013.01); *G06F 3/04842* (2013.01); *G06F 3/04845* (2013.01); *G01R 13/02* (2013.01)

(58) Field of Classification Search
CPC combination set(s) only.
See application file for complete search history.

(56) References Cited

U.S. PATENT DOCUMENTS

| | | | |
|---|---|---|---|
| 4,821,030 A | | 4/1989 | Batson et al. |
| 6,064,372 A | * | 5/2000 | Kahkoska ............. G06F 1/1601 345/173 |
| 6,088,029 A | | 7/2000 | Guiberson et al. |

(Continued)

FOREIGN PATENT DOCUMENTS

| | | |
|---|---|---|
| CN | 101061946 A | 10/2007 |
| CN | 201035054 Y | 3/2008 |

(Continued)

OTHER PUBLICATIONS

Extended European Search Report, dated Dec. 14, 2017, for European Application No. 14159310.3-1568 / 2778883, 8 pages.

(Continued)

*Primary Examiner* — Steven B Theriault
(74) *Attorney, Agent, or Firm* — Seed Intellectual Property Law Group LLP

(57) ABSTRACT

In at least one embodiment, a handheld measurement system generates a measurement image derived from measurement data that is generated and/or received by the handheld measurement system. The handheld measurement system also generates a plurality of option images that each correspond to a particular selectable option. A display screen, which may be a touch screen, simultaneously displays the measurement image and the option images. The measurement device modifies the measurement image and/or the option images in response to received option image selections.

15 Claims, 10 Drawing Sheets

(51) Int. Cl.
*G06F 3/0484* (2013.01)
*G01R 13/02* (2006.01)

(56) References Cited

U.S. PATENT DOCUMENTS

| | | | | |
|---|---|---|---|---|
| 6,140,811 A * | 10/2000 | Little | ............... | G01R 15/125 324/115 |
| 6,271,654 B1 * | 8/2001 | Chen | ............... | G01R 15/125 324/115 |
| 6,823,283 B2 * | 11/2004 | Steger | ............... | G16H 40/40 702/127 |
| 6,927,564 B2 | 8/2005 | Arnoux et al. | | |
| 6,985,819 B2 | 1/2006 | Lipscomb et al. | | |
| 7,310,583 B2 * | 12/2007 | De La Quintana | .. | G01R 15/125 700/245 |
| 7,468,602 B2 * | 12/2008 | Sleeman | ............ | G01R 15/125 324/115 |
| 7,626,375 B2 | 12/2009 | Garland et al. | | |
| 8,195,413 B2 | 6/2012 | Friedhof | | |
| 8,269,481 B2 | 9/2012 | Garland et al. | | |
| 8,456,152 B2 | 6/2013 | Garland et al. | | |
| 8,624,580 B2 | 1/2014 | Reich et al. | | |
| 8,732,604 B2 | 5/2014 | Okamoto et al. | | |
| 9,739,801 B2 * | 8/2017 | Anderson | ............... | G01R 1/30 |
| 2001/0000964 A1 | 5/2001 | Alexander | | |
| 2003/0034769 A1 * | 2/2003 | Lipscomb | ............ | G01R 15/125 324/99 D |
| 2003/0169257 A1 | 9/2003 | Alexander et al. | | |
| 2003/0200044 A1 | 10/2003 | McTigue et al. | | |
| 2004/0041793 A1 * | 3/2004 | Redding | ............ | G01R 15/125 345/173 |
| 2004/0113773 A1 | 6/2004 | Nieters et al. | | |
| 2005/0135259 A1 | 6/2005 | Yazdi et al. | | |
| 2005/0164684 A1 * | 7/2005 | Chen | ............... | G05B 19/0423 455/414.1 |
| 2006/0289768 A1 | 12/2006 | Vallese et al. | | |
| 2007/0100520 A1 * | 5/2007 | Shah | ............... | G07C 5/008 701/31.4 |
| 2007/0156313 A1 * | 7/2007 | Fudali | ............... | G07C 5/008 701/31.4 |
| 2007/0179754 A1 * | 8/2007 | Sper | ............... | H04Q 9/00 702/189 |
| 2007/0271067 A1 | 11/2007 | Cohn et al. | | |
| 2008/0103375 A1 | 5/2008 | Kiani | | |
| 2009/0049005 A1 * | 2/2009 | Van Wart | ............... | G06Q 10/06 |
| 2009/0054743 A1 | 2/2009 | Stewart | | |
| 2009/0128124 A1 * | 5/2009 | Garland | ............... | G01R 15/125 324/115 |
| 2009/0128126 A1 | 5/2009 | Garland et al. | | |
| 2009/0128128 A1 * | 5/2009 | Garland | ............... | G01R 15/125 324/115 |
| 2009/0140721 A1 | 6/2009 | Garland et al. | | |
| 2009/0141593 A1 * | 6/2009 | Taha | ............... | G01D 7/02 368/10 |
| 2009/0265126 A1 * | 10/2009 | Freidhof | ............... | G01R 13/029 702/68 |
| 2010/0016700 A1 | 1/2010 | Sieh et al. | | |
| 2010/0099964 A1 * | 4/2010 | O'Reilly | ............... | A61B 5/14546 600/323 |
| 2010/0131653 A1 * | 5/2010 | Dharwada | ............... | G06F 3/0483 709/227 |
| 2010/0231197 A1 | 9/2010 | Jamieson et al. | | |
| 2011/0144586 A1 | 6/2011 | Michaud et al. | | |
| 2012/0001768 A1 * | 1/2012 | Radosavljevic | ......... | H04Q 9/00 340/870.03 |
| 2012/0007588 A1 * | 1/2012 | Tan | ............... | G01R 1/22 324/126 |
| 2012/0095309 A1 | 4/2012 | Price et al. | | |
| 2012/0188185 A1 | 7/2012 | Cassar | | |
| 2012/0245878 A1 * | 9/2012 | Kane | ............... | G05B 15/02 702/116 |
| 2012/0274664 A1 * | 11/2012 | Fagnou | ............... | G06F 3/04855 345/660 |
| 2013/0127904 A1 * | 5/2013 | Dove | ............... | G06F 3/0488 345/629 |
| 2013/0207929 A1 * | 8/2013 | Farmer | ............... | G01R 13/029 345/174 |
| 2013/0239709 A1 * | 9/2013 | Dolleris | ............... | G01R 15/125 73/866.3 |
| 2014/0035607 A1 * | 2/2014 | Heydron | ............... | G01R 1/04 324/754.02 |
| 2014/0039838 A1 * | 2/2014 | Katz | ............... | G01R 1/04 702/188 |

FOREIGN PATENT DOCUMENTS

| | | |
|---|---|---|
| CN | 201417452 Y | 3/2010 |
| CN | 101714059 A | 5/2010 |
| CN | 102568170 A | 7/2012 |
| CN | 102945276 A | 2/2013 |
| EP | 2 026 079 A2 | 2/2009 |

OTHER PUBLICATIONS

Chinese Search Report, dated Aug. 25, 2017, for Chinese Application No. 201410094944.X, 3 pages.

* cited by examiner

HANDHELD MEASUREMENT SYSTEM WITH SELECTABLE OPTIONS

BACKGROUND

Handheld measurement tools such as digital multimeter (DMM) devices are used to measure a variety of parameters in a wide array of industrial and household settings. Sometimes a technician using a handheld measurement tool needs to measure a property of a system over an extended period of time, for example, to determine the presence of an intermittent fault. To perform such measurements, a technician has traditionally been required to record the readings manually. Further analysis of the measured data has traditionally required that a technician manually enter the measured data into a computer.

Some types of troubleshooting requires multiple instrument readings at different locations, and sometimes these measurements need to occur simultaneously or in close time proximity. Furthermore, calculations may need to be manually performed on measured data received from different locations.

Recently, more extensive multi-device measurement functionality and data storage have been incorporated into handheld measurement tools. Some measurement tools are now capable of displaying readings from remote measurement modules and storing measured data. However, adding multi-device functionality and storage capabilities brings concerns that the handheld measurement tools will be overly complex and difficult to use.

BRIEF SUMMARY

The following brief summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one embodiment of the present disclosure, a handheld measurement system is provided. The measurement system generally includes a measurement device, a processor and a touch screen system. The processor receives primary measurement data for the measurement device. The processor is configured to generate a measurement image derived from the primary measurement data. The processor is also configured to generate a plurality of option images, wherein each option image corresponds to a particular option. A touch screen system communicatively coupled to the processor, wherein the touch screen system is configured to display the measurement image and the option images, and wherein the displayed option images are selectable. The processor is configured to modify the measurement image in response to a selection of a displayed option image.

In at least one embodiment of the present disclosure, a handheld digital multimeter is provided. The handheld digital multimeter is configured to measure at least one electrical parameter and generate a measurement image derived from the at least one measured electrical parameter. The handheld digital multimeter is also configured to generate a plurality of option images, wherein each option image corresponds to a particular option, and display the measurement image and the option images on a touch screen, wherein the measurement image and the option images are displayed simultaneously. The displayed option images are selectable by an input into the touch screen. The measurement device is configured to modify the measurement image in response to a selection of at least one of the displayed option images.

Furthermore, in at least one embodiment, a method for displaying a measurement image on a handheld device comprises measuring at least one parameter with a handheld measurement device and generating a measurement image, wherein the generated measurement image is derived from the measured parameter. The method further includes generating a plurality of option images, and displaying the generated measurement image and the generated option images on a touch screen. The measurement image and the option images are displayed simultaneously. Each displayed option image corresponds to a selectable option. The method further includes modifying the measurement image displayed on the touch screen in response to a selection of a particular option image displayed on the touch screen.

BRIEF DESCRIPTION OF THE SEVERAL VIEWS OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

In various embodiments, disclosed herein are systems and methods for displaying an image derived from measured parameters. The disclosed systems and methods allow an image to be displayed and modified while multiple selectable options are simultaneously present. Parameters may be included or excluded into or out of an image in response to user touch inputs. Potential operations based on the measurement inputs are determined and displayed. Examples of the systems and methods of the present disclosure will provide advantages to users of handheld measurement tools, especially for users that are storing data or taking multiple simultaneous measurements.

Figure 1:
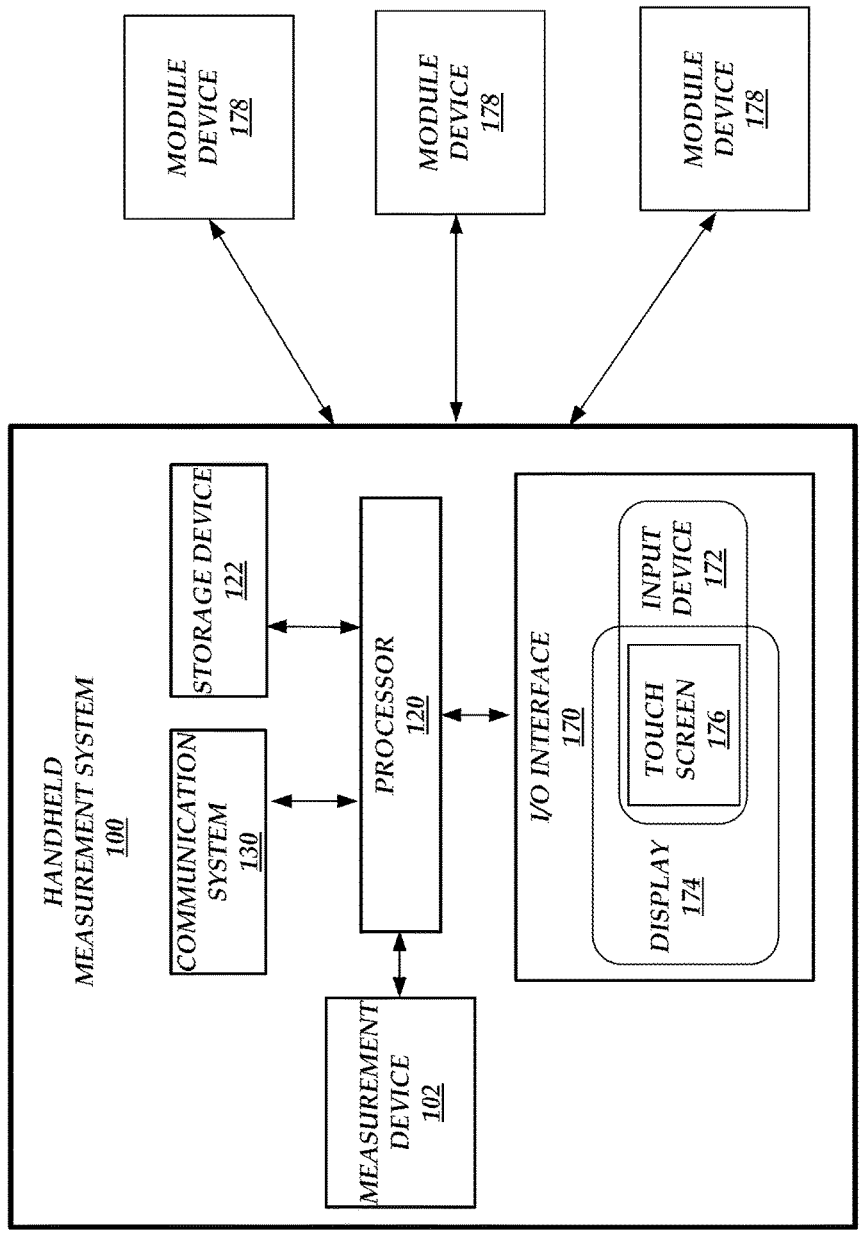
FIG. 1 illustrates a block diagram of an exemplary handheld measurement system.

FIG. 1 illustrates a block diagram of a handheld measurement system 100. The handheld measurement system 100 is only one example of a suitable handheld measurement system and is not intended to suggest any limitation as to the scope of use or functionality of the disclosed embodiments. In various embodiments, the handheld measurement system may be, for example, a DMM, a Wi-Fi network tester, a vibration tester, etc. However, the handheld measurement system 100 could include any type of mobile testing/measurement device or could be a multipurpose device capable of performing a combination of types of measurements.

As will be better understood from the following description, as used herein, the term measured parameter refers to data that directly or indirectly relates to a measured property. Handheld measurement system 100 may measure all types of parameters, such as electrical and mechanical parameters. As an example, properties may that may be measurable by the handheld measurement system include, for example, vibration, humidity, pressure, temperature, sound, and many others.

A handheld measurement system 100 or device as described herein includes one or more devices generally configured to be held in a user's hand while taking a measurement. However, it should be appreciated that the system or device need not always be held in a user's hand and may be positioned by a user to not be held, for example, by affixing or hanging the system or device from a support or from a machine.

Still referring to FIG. 1, the handheld measurement system 100 includes a processor 120, a storage device 122, a communication system 130, and an I/O interface 170. As used herein, the term processor is not limited to integrated circuits referred to in the art as a computer, but broadly refers to a microcontroller, a microcomputer, a microprocessor, a programmable logic controller, an application specific integrated circuit, other programmable circuits, combinations of the above, among others. The processor 120 serves as the computational center of the handheld measurement system 100 by supporting the execution of instructions and reading and writing data to the storage device 122, I/O interface 170, and communication system 130. The storage device 122 includes one or more forms of computer-readable storage media. Computer-readable storage media is any currently available or later developed media suitable for storing programs and data accessible by one or more device components, such as the processor 120. Computer readable storage media may be removable or non-removable and may be volatile or non-volatile. Examples of computer-readable storage media may include hard drives as well as RAM, ROM, EEPROM, flash types of memory, etc.

Figure 4:
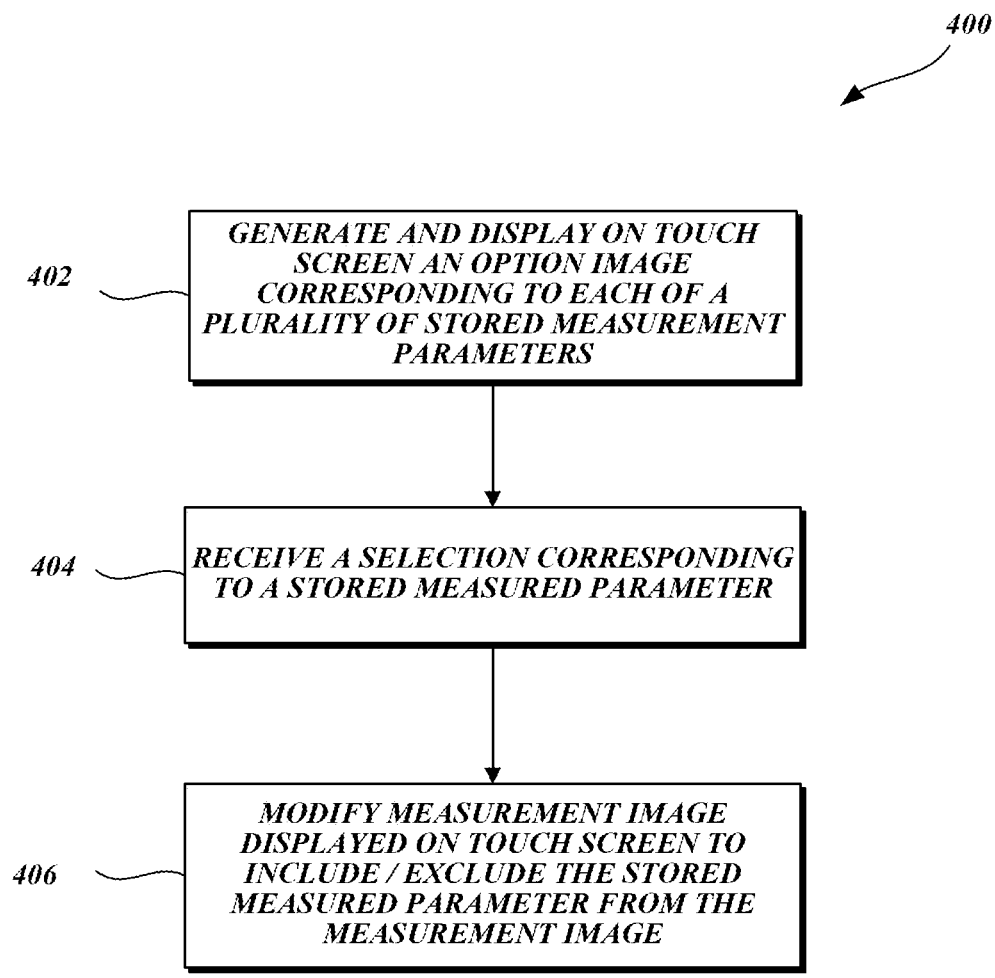
FIG. 4 illustrates yet another example of a process that may be performed by the handheld measurement system illustrated in FIG. 1.
Figure 5:
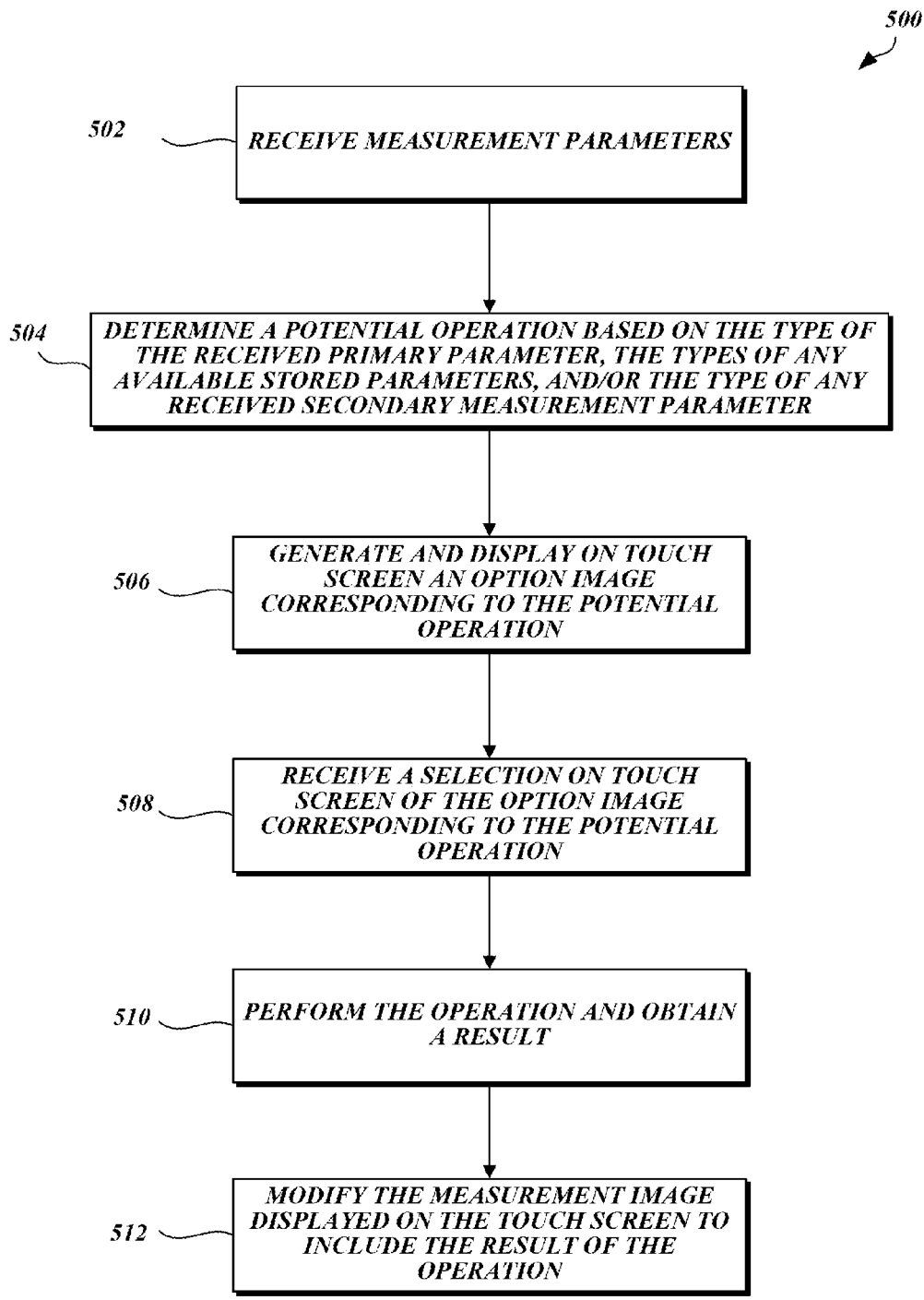
FIG. 5 illustrates still yet another example of a process that may be performed by the handheld measurement system illustrated in FIG. 1.

Communication system 130 includes one or more components for communicating with an external device, such as a wireless device. All such communication may be wired or wireless. In some embodiments, the handheld measurement system 100 is communicatively coupled to one or more module devices 178, preferably over a wireless path. In some embodiments, module devices 178 are independent devices, that is, module devices that communicate independently. In some embodiments, the handheld measurement system 100 is coupled to a plurality of test tools such as CNX 3000 test tools made by Fluke Corporation. The module devices 178 may communicate measurement parameters or measurement data to the handheld measurement system 100 over a wireless path. In some embodiments, the module devices 178 include processors or other logic circuitry and may process measured data into different forms and pass the processed measurement data to the handheld measurement system 100. In some embodiments, the received measured parameters are stored by the handheld measurement system 100 in the storage device 122. The stored measurement parameters may later be retrieved and used in exemplary processes 400 and 500, for example, as shown in FIGS. 4 and 5. In some embodiments, the handheld measurement system 100 may control or command the module devices 178.

The I/O interface 170 includes an input device 172, a display 174, and a touch screen 176. The I/O interface 170 may include any devices that allows a user to control or an external system to interact with the processor 120 and any devices that would allow the processor 120 to display information, such as images. In at least one embodiment, the I/O interface 170 allows a user to control or configure the measurement device 102 to perform a particular measurement or request particular data from the measurement device 102. Information regarding the particular configuration of measurement device 102 may be stored in the storage device 122.

The display 174 may be, for example, a liquid crystalline display (LCD) device, a light emitting diode (LED) device, and/or an organic light emitting diode (OLED) device. The display 174 may be capable of displaying color images, though embodiments disclosed herein can also be made to work with black and white displays. The display 174 includes the touch screen 176, which, in some embodiments, incorporates the input device 172 into the display 174. The touch screen 176 may be any type of touch screen currently known or later developed. For example, the touch screen 176 may be a capacitive, infrared, resistive, or surface acoustic wave (SAW) device. In response to an input by the input device 172, the handheld measurement system 100 may display information or data related to a specific measurement. For many measurement tool applications, the touch screen 176 in some embodiments is suitable for use in industrial settings. In some embodiments, the touch screen 176 is able to receive inputs through gloved hands.

In addition to the touch screen 176, the input device 172 may include a single input device or a combination of input devices configured to communicate an input to the handheld measurement system 100. The input device 172 may include, for example, buttons, switches, trigger switches, selectors, a rotary switch or other input devices known to those of ordinary skill in the art. In at least one embodiment, the measurement device 102 is configured to perform a particular type of measurement in response to a user input or selection that is input to the input device 172.

Figure 2:
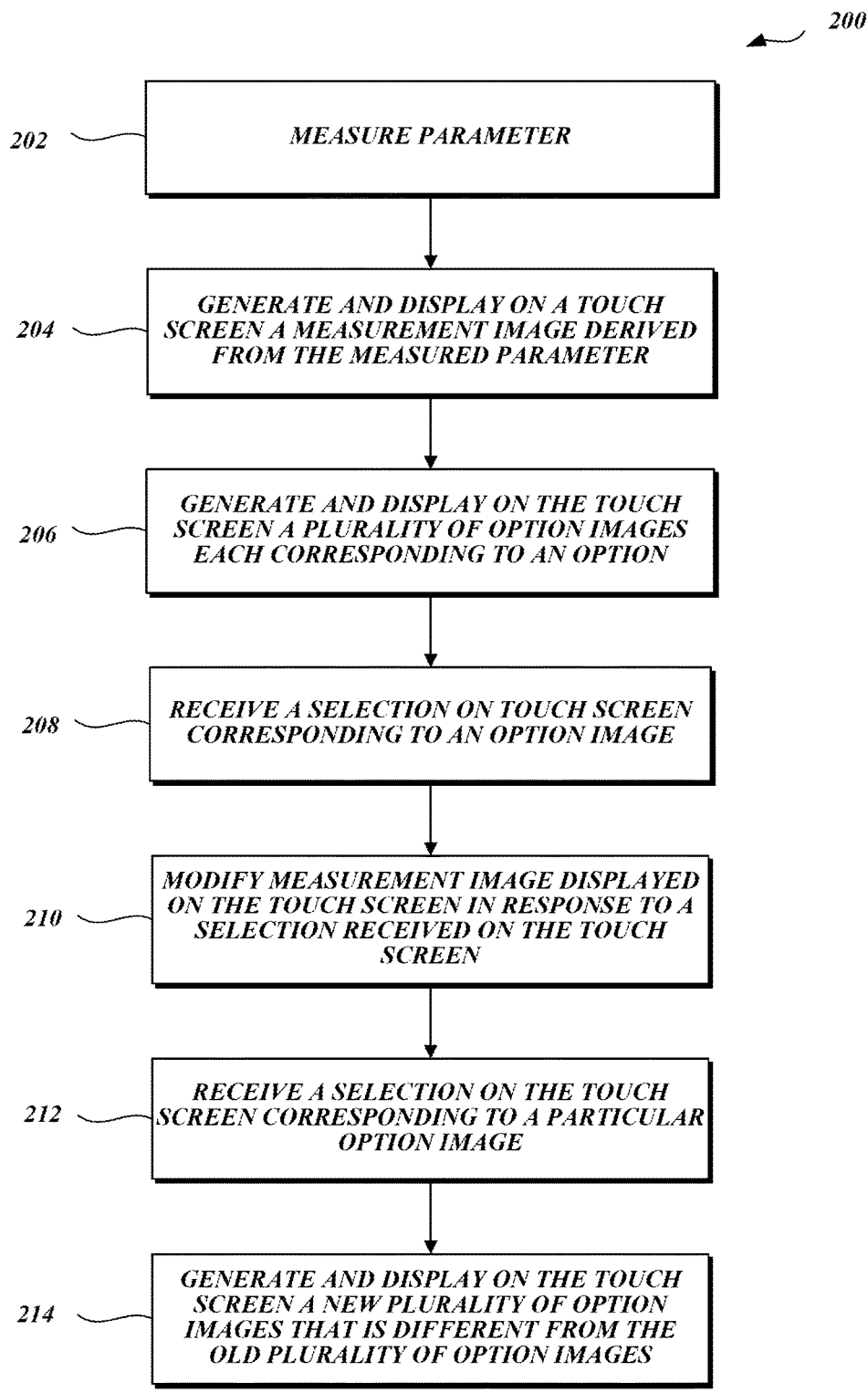
FIG. 2 illustrates one example of a process that may be performed by the handheld measurement system illustrated in FIG. 1.

FIG. 2 illustrates one example of a process 200 that may be performed by the handheld measurement system 100. At block 202, the handheld measurement system 100 measures a parameter using the measurement device 102. The handheld measurement system 100 may measure, for example, electrical and/or mechanical parameters. At block 204, the handheld measurement system 100 generates and displays on the touch screen 176 a measurement image derived from the measured parameter. The measurement image may include a textual representation of the measured parameter or a graphical representation of the measured parameter. In some embodiments, a received measured parameter is used by the measurement system 100 to determine another property. For example, if the measured parameter for a system is current, and the handheld measurement system receives a measured parameter corresponding to voltage, the measurement image may include a textual representation of the power.

Figure 7A:
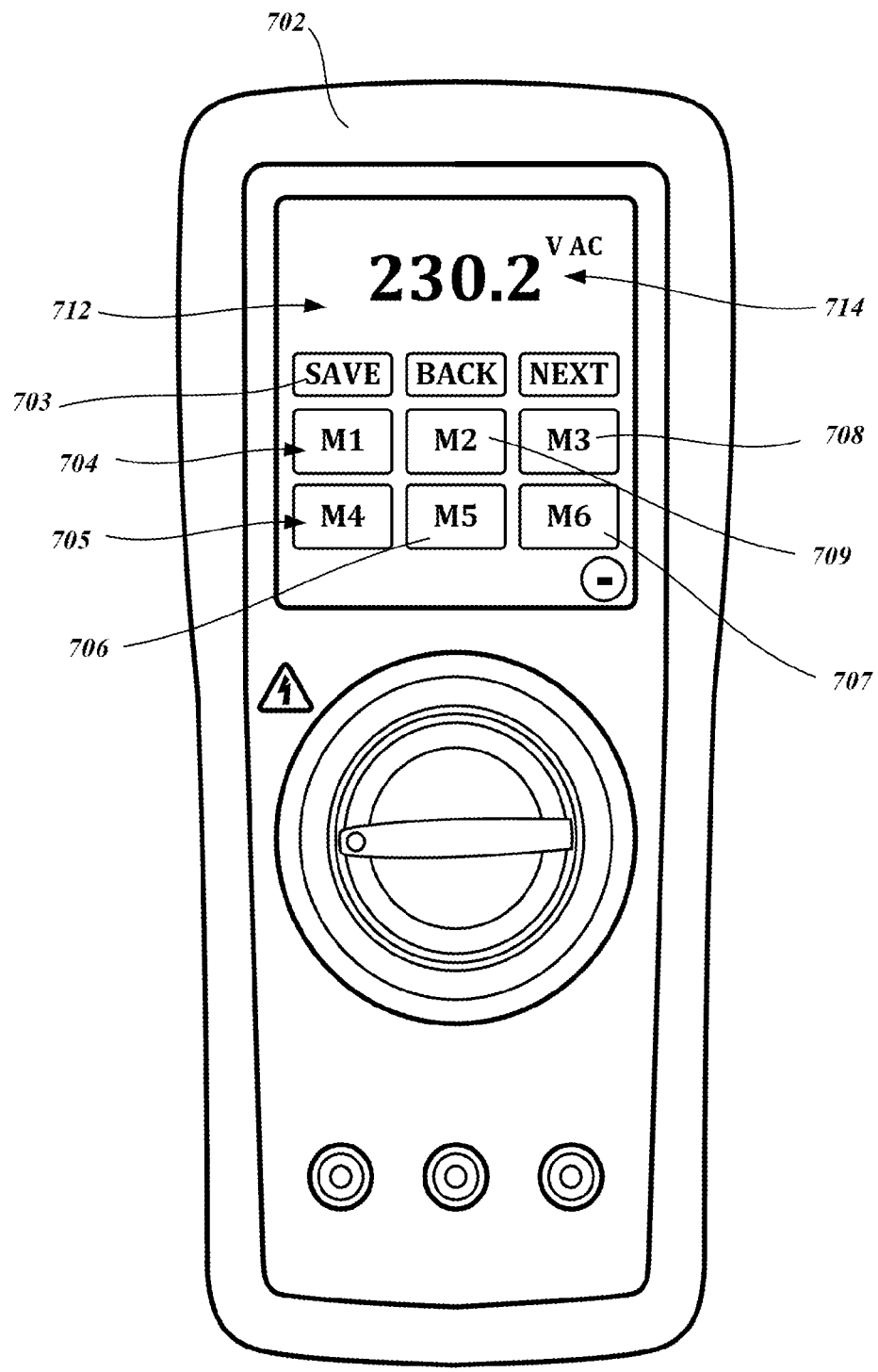
FIG. 7A illustrates another example of a handheld measurement system.
Figure 7B:
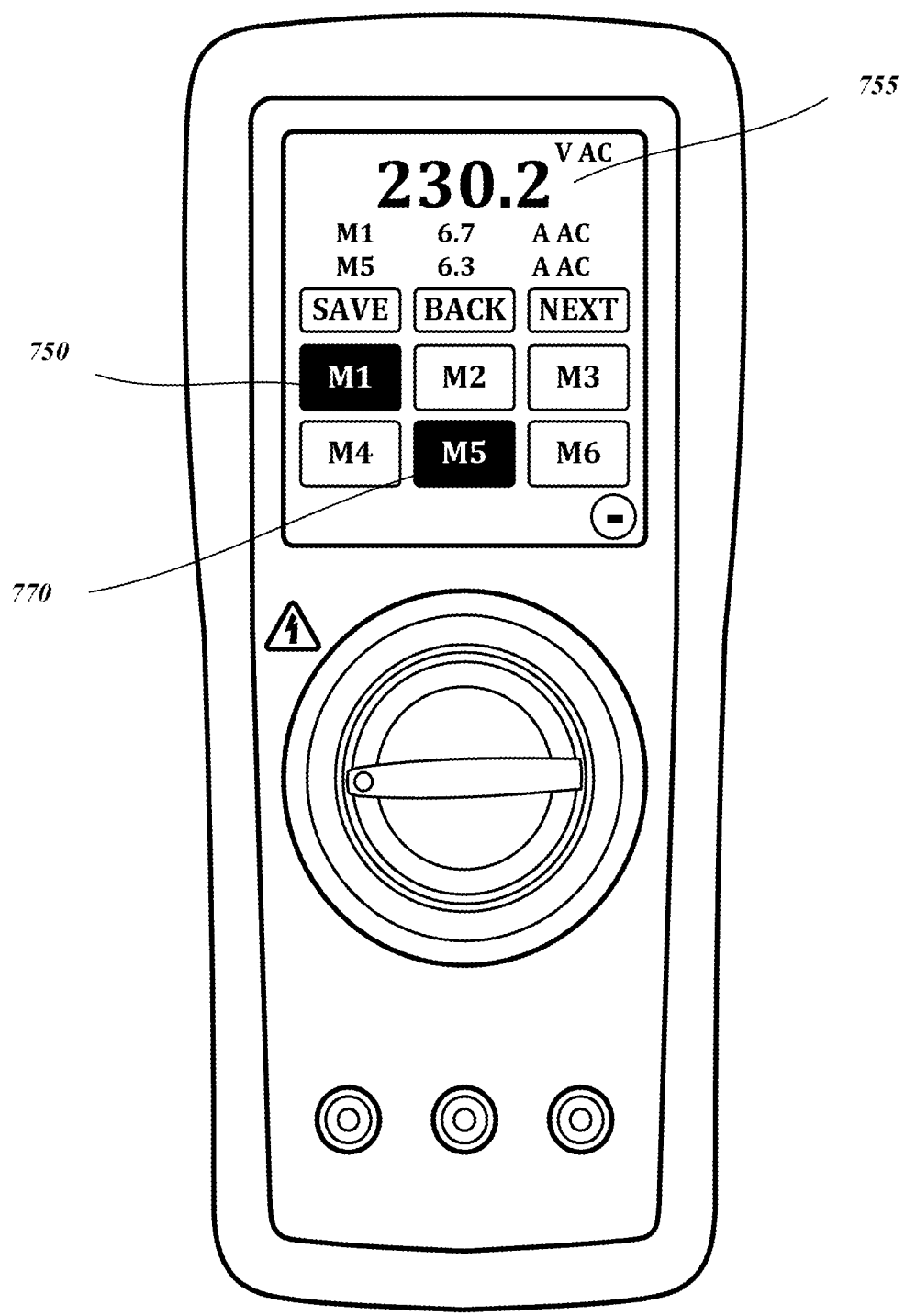
FIG. 7B illustrates an exemplary embodiment of another handheld measurement system.

At block 206, the handheld measurement system 100 generates and displays on the touch screen 176 a plurality of option images. Each option image corresponds to a particular option. Option images are shown in FIGS. 7A and 7B, for example. Option images may be associated with stored data, data received from other devices or modules, or operations that may performed. As will be discussed in more detail below, in response to receiving a selection corresponding to a particular option image on the touch screen 176, the handheld measurement system 100 may modify the plurality of option images or the measurement image.

At block 208, the handheld measurement system receives an input to the touch screen 176 corresponding to a particular option image. In response to receiving an input at an option image on the touch screen 176, at block 210, the handheld measurement system 100 modifies the measurement image displayed on the touch screen 176. As shown in FIGS. 4 and 5, the handheld measurement system 100 may add or remove measurement data or add or remove stored data from the measurement image. In some embodiments, the handheld measurement system 100 may also generate additional option images.

At block 212, the handheld measurement system 100 receives a selection on the touch screen 176 corresponding to a particular option image. For example, the selection on the touch screen 176 may correspond to a request for stored measured parameters. At block 214, the handheld measurement system 100 generates and displays on the touch screen 176 a new plurality of option images that is different from the old previously displayed images.

Figure 3:
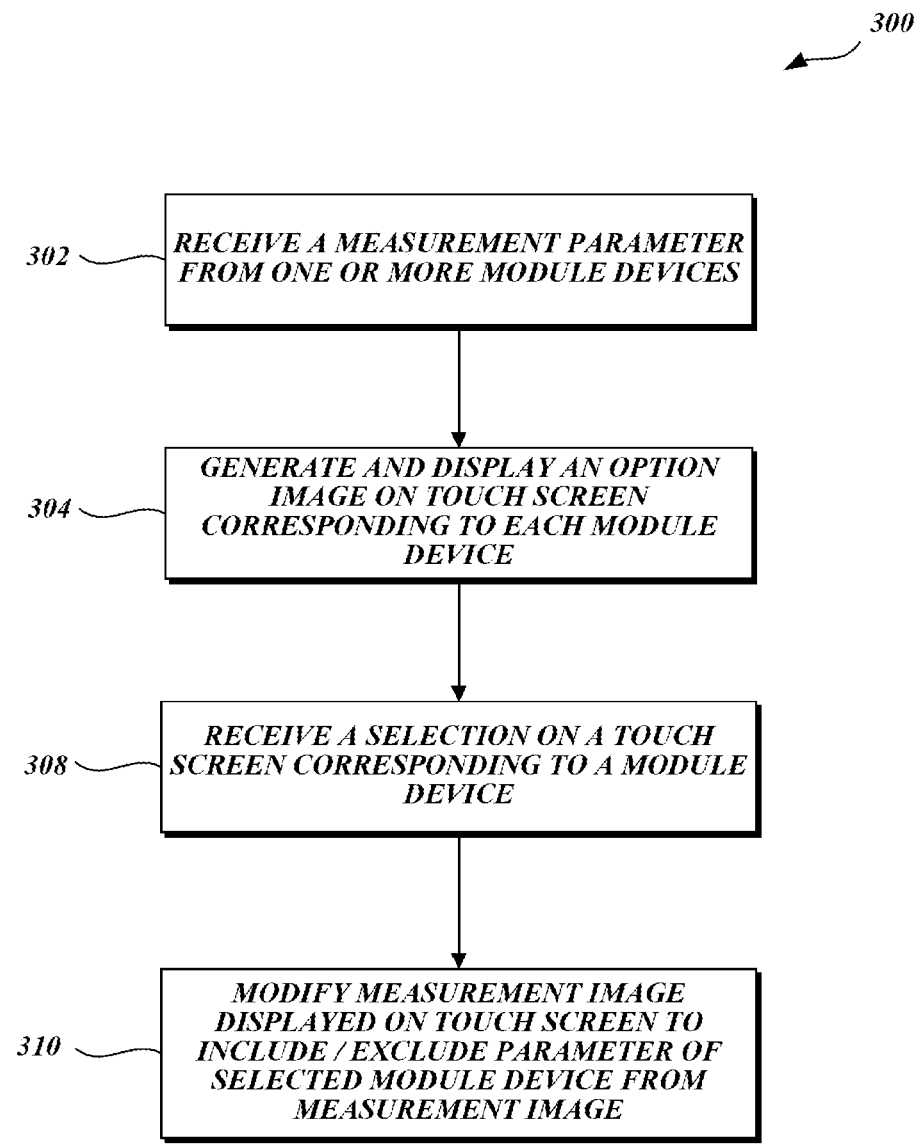
FIG. 3 illustrates another example of a process that may be performed by the handheld measurement system illustrated in FIG. 1.

FIG. 3 illustrates another example of a process 300 that may be performed by the handheld measurement system 100. At block 302, the handheld measurement system 100 receives a measurement parameter from one or more of the module devices 178. At block 304, the handheld measurement system 100 generates and displays an option image on the touch screen 176 corresponding to a module device 178. At block 308, a selection is received on an option image corresponding to a particular module device 178. At block 310, the handheld measurement system 100 adds or removes the measured parameter of the selected module device from the measurement image.

FIG. 4 illustrates another example of a process 400 that may be used with the handheld measurement system 100. At block 402, the handheld measurement system 100 generates and displays on touch screen 176 an option image corresponding to each of a plurality of measurement parameters stored in storage device 122. At block 404, the handheld measurement system 100 receives a selection corresponding to a stored measured parameter. At block 406, the handheld measurement system 101 modifies the measurement image displayed on the touch screen 176 to include or exclude a stored measured parameter.

Figure 8A:
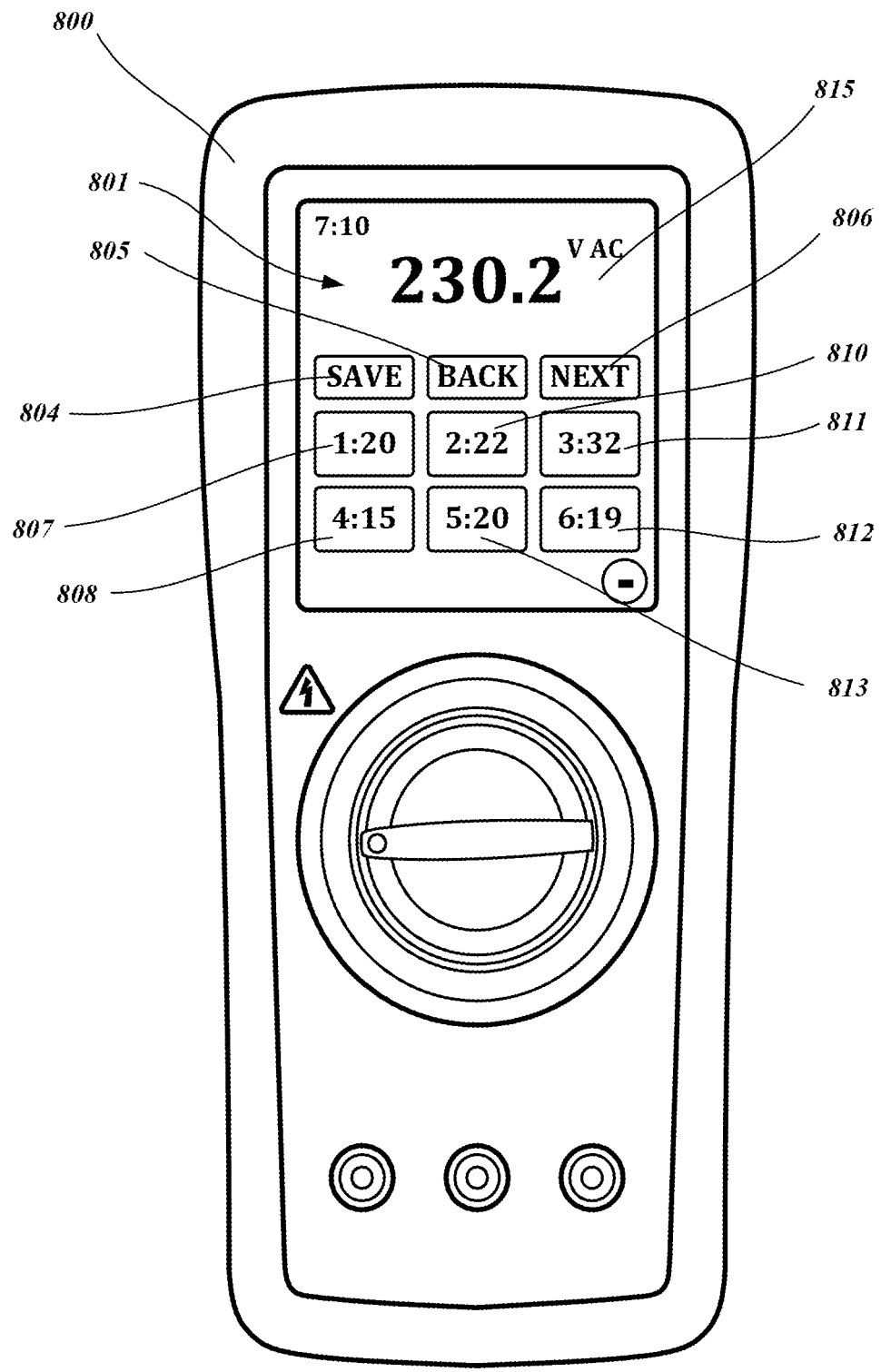
FIG. 8A illustrates another example of a handheld measurement system.

Turning now to FIG. 8A, a handheld DMM system 800 is depicted. Touch screen 801 displays a measured image 815, which is a textual representation of a measurement parameter measured by the DMM system 800. A plurality of option images are displayed on the touch screen 801. Selection or touching an option image 804 ("SAVE") causes the measured parameter shown in measured image 815 to be saved. Selection or touching an option image 805 ("BACK") recreates the previously displayed image options and corresponding choices. Selection or touching an option image 806 ("NEXT") generates new option images and corresponding choices. An image option 807 ("1:20") refers stored data for a particular time. An image option 808 (4:15) also refers to stored data for a particular time as do image options 810 ("2:22"), 811 ("3:32"), 812 ("6:19"), and 813 ("5:20").

Figure 8B:
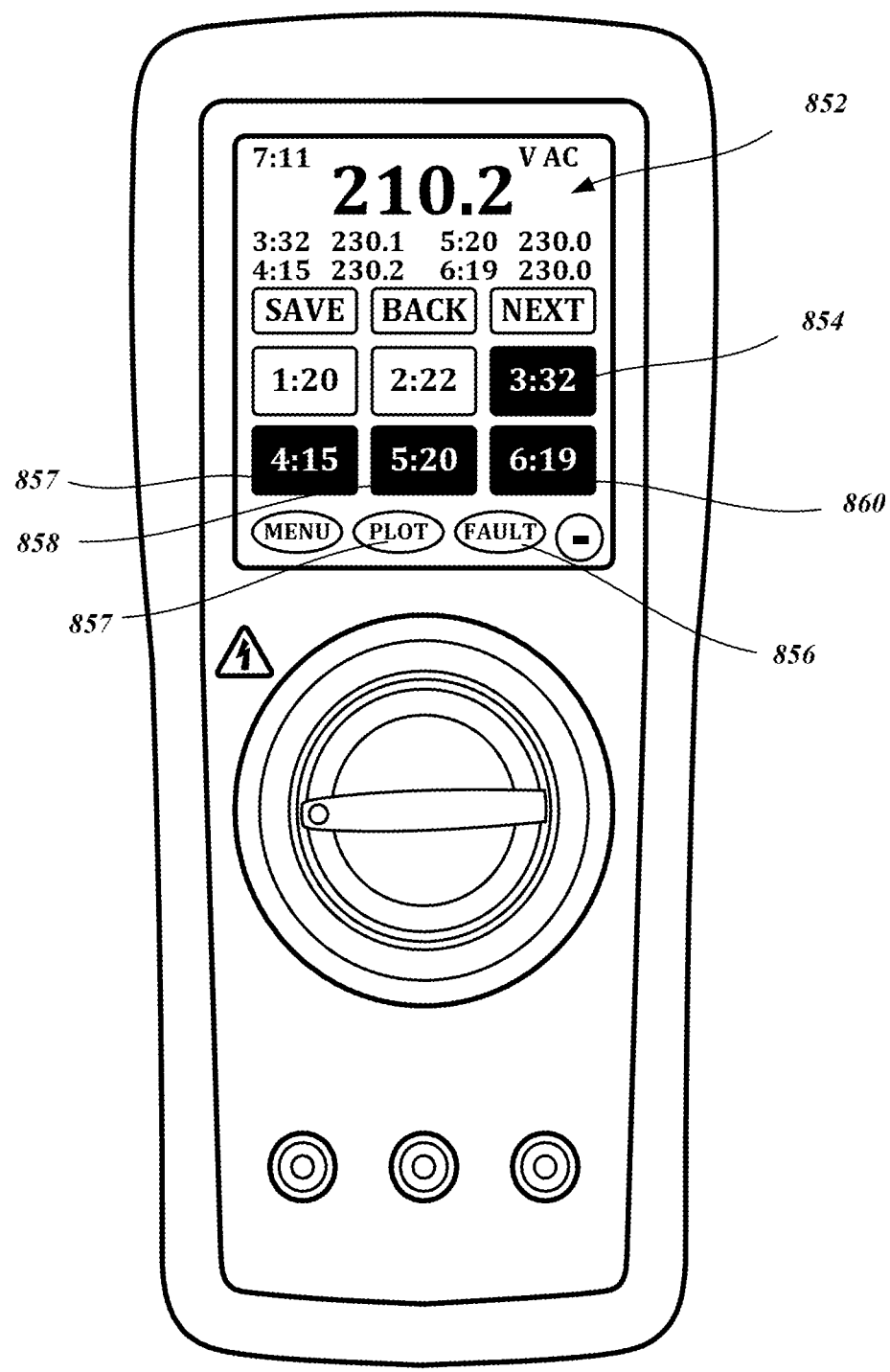
FIG. 8B illustrates another example of a handheld measurement system.

Referring now to FIG. 8B, a measurement image 852 includes a measured parameter 852 ("210.2"), which is numerically lower than the measured parameter shown in the measurement image 815 ("230.2") of FIG. 8A. Option images 854, 857, 858, and 860 of FIG. 8B are a darker color to indicate selection. In FIG. 8B, the measurement image 852 includes stored measurement parameters. The transition from 8A to 8B shows the selection of option images and the corresponding modification of the measurement image as described in process 400. Also, part of the process 500 to be described below is shown in FIGS. 8A and 8B.

FIG. 5 illustrates one example of a process 500 for determining a potential operation and including a result in the measurement image. Process 500 may be automatically initiated in response to receiving particular measured parameters or it may be initiated in response to an input to the touch screen or other input device 172. At block 502, the handheld measurement system 100 receives measured parameters. The received measured parameters may include one or more parameters measured by the measurement device 102. The received measurement parameters may also include measured parameters from the module devices 178. As previously mentioned, parameters received by the measurement system 100 may include, for example, electrical and/or mechanical parameters. In some embodiments, only those parameters that are included in the measured image at the time of the determination are considered in the determination of a potential operation.

At block 504, the system 100 determines a potential operation based on the received measured parameters and/or the stored measured parameters. In an exemplary embodiment, the system 100 determines the measurement parameters received from three module devices 178, which, for example, are AC currents below 35 amps, and the measured parameter received by the measurement device 102 is 0.0 V AC. Based on this information, in one embodiment the system 100 determines that a potential operation is, for example, a current imbalance test. The system 100 may determine a potential operation for a set of parameters using a look-up table, user setting, computer program, algorithms, or other methods known in the art. The system 100 may determine a potential operation by factors other than parameters. For example, a potential operation may be determined because it is a default operation, or is based on a user history for the handheld measurement system 100. In some embodiments, more than one potential operation may be determined. Examples of potential operations may include max/min determination, plotting, calculated power, standard deviation, fault detection, power interruption test, continuity phase measurement, etc. Any possible operation using stored parameters or received measured parameters may be a potential operation.

After determining a potential operation at block 504, the handheld measurement system 100 generates and displays on the touch screen 176 an option image corresponding to the potential operation at block 506. If more than one potential operation is determined, more than one option image may be generated and displayed. At blocks 508 and 510, in response to a selection input to the touch screen 176, the handheld measurement system 100 performs the operation and obtains a result. In an embodiment where a current imbalance operation is performed, one result is the indication of a particular module device 178 that is measuring a current that is higher or lower than the current of the other module devices 178. Another potential result in a current imbalance operation is that no imbalance exists. At block 512, the measurement image is modified to include the result of the operation. The result may be included into the measurement image and may indicate the result as text, color change, format change, graphs, icons, alert images, shading, etc.

Referring back to FIGS. 8A and 8B, a significant voltage drop is indicated as having occurred from FIGS. 8A to 8B. In response to the voltage drop, a potential operation was determined and displayed as option image 856 ("FAULT"). Selecting Option image 856 will initiate a fault finding application to determine the fault. Furthermore, the selection of stored measurement data resulted in the determination and display of option image 857 ("PLOT"). Selecting the option image 857 would modify the measurement image to display a plot. Importantly, all of the processes in some embodiments are occurring while the measurement parameter measured by the measurement device 102 is displayed on the touch screen.

Figure 6:
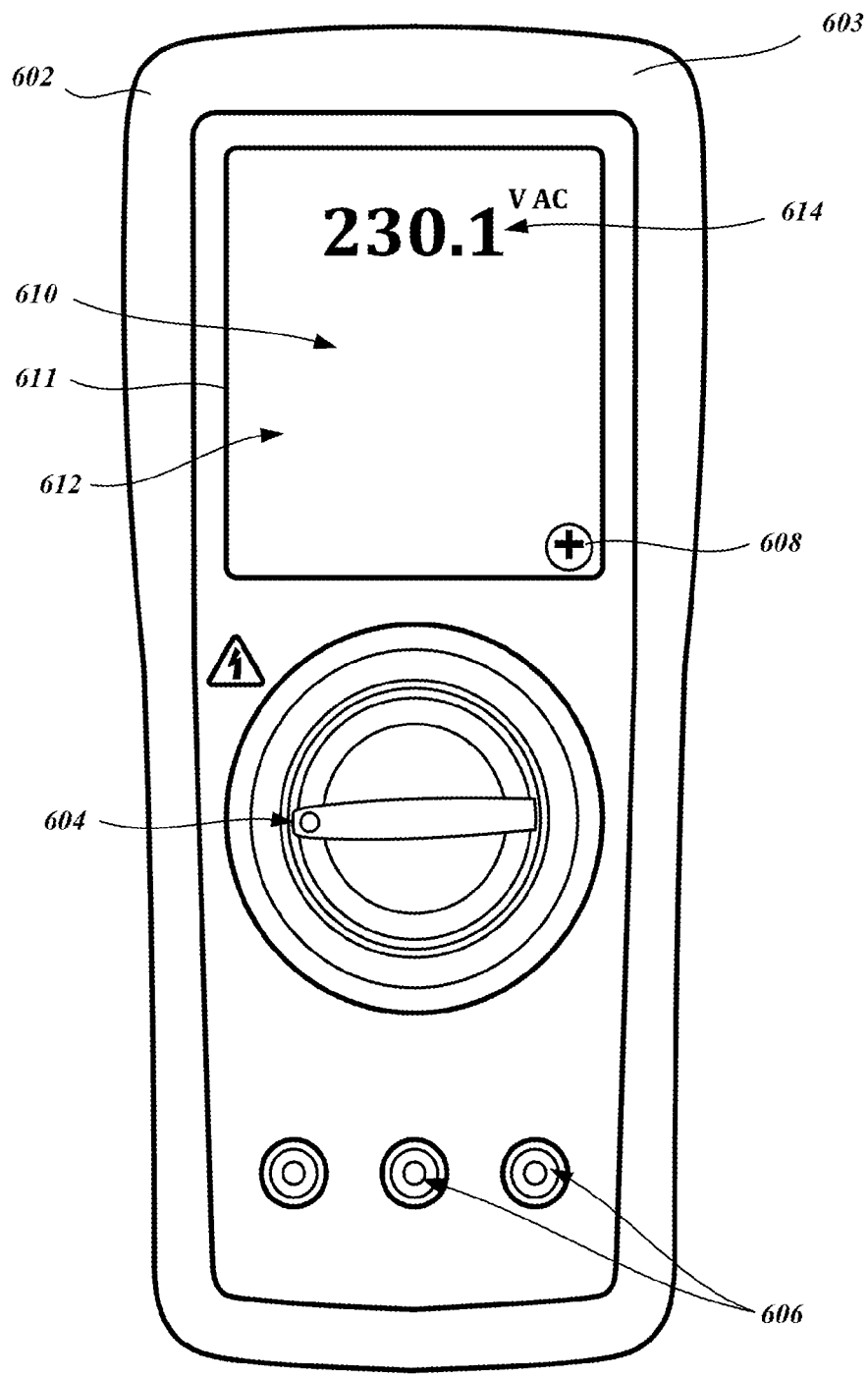
FIG. 6 illustrates one example of a handheld measurement system.

FIG. 6 is a front view of a DMM system 602 showing an absence of displayed option images in accordance with embodiments of the present disclosure. The DMM system 602 includes a rotary switch 604, terminals 606, a display 611, a touch screen 612, and a housing 603. The housing 603 surrounds a part of the system 602 at an outer layer. Terminals 606 allow for measurement instruments, such as leads or probes (not shown), to be connected to the DMM system 602 and allow for the DMM system 602 to receive measured parameters. The housing 603 provides an insulation barrier around device circuitry as well as reducing the chance of undesired contact between the user with the touch screen 612. Rotary switch 604 may be used to configure the device to take particular measurements. Rotary switch 604 is presently configured to be set at "V AC" (Volts AC), which is displayed by the touch screen 612 as part of the measurement image 614. The measurement image 614 includes text "230.1 V AC", which is the AC voltage as measured between the terminals 606. The touch screen includes a lower portion 610 that presently does not include any option image. A maximize image 608 ("+") is displayed on the touch screen 612. If an input is received on touch screen 612 via the maximize icon 608, option images will be generated.

FIG. 7A is front view of a DMM system 702 showing option images corresponding to a plurality of module devices in accordance with embodiments of the present disclosure. The DMM system 702 includes a touchscreen 712 displaying a measurement image 714 that includes text "230.2 V AC," which is the AC voltage measured by the DMM system 702. The DMM system 702 includes a plurality of option images. A "Save" option image 703 is displayed on the touch screen 712. In some embodiments, selection of the "SAVE" option image causes the DMM system 702 to save the measurement image or the current measured parameter in the storage device 122. Option images 704 ("M1"), 705 ("M4"), 706 ("M5"), 708 ("M3"), and 709 ("M2") correspond to module devices 178. As previously discussed, the handheld measurement system 100 may receive measurement parameters from the module devices 178. In FIG. 7B, option images 750 and 770 have been selected. As described in FIG. 3 in regard to process 300, the measurement image 755 is modified to include the measured parameters from two module devices 178 (M1 and M5) as shown in FIG. 7B. This allows for real-time measurements from multiple devices to be selected and displayed on touch screen 712. Other module devices could be selected and/or deselected allowing a user to manage six or more module devices while also receiving and displaying measurement parameters from measurement device 102.

While illustrative embodiments have been illustrated and described, it will be appreciated that various changes can be made therein without departing from the spirit and scope of the invention as claimed.

The embodiments of the invention in which an exclusive property or privilege is claimed are defined as follows:

1. A handheld measurement system comprising:
   a measurement device;
   a processor that receives primary measurement data from the measurement device, generates a measurement image derived from the primary measurement data, and generates a plurality of option images, wherein each option image corresponds to a particular option;
   a touch screen that simultaneously displays the measurement image and the option images, wherein each of the displayed option images are selectable, and wherein the measurement device modifies the measurement image in response to selection of one or more displayed option images; and
   a communication system that receives secondary measurement data comprising first measurement data measured by a first module device and second measurement data measured by a second module device, wherein the first and second module devices are separate from each other and separate from the measurement device,
   wherein a first displayed option image corresponds to the first measurement data measured by the first module device, and a second displayed option image corresponds to the second measurement data measured by the second module device,
   wherein the processor modifies the measurement image to exclude or include:
     the first measurement data in response to selection of the first displayed option image, and
     the second measurement data in response to selection of the second displayed option image, and
   wherein the touch screen further displays a third option image corresponding to an operation that is determined by the processor based on a type of measurement data in the primary measurement data and a type of measurement data in the first or second measurement data that is included in the measurement image, wherein, in response to selection of the third option image corresponding to the operation, the processor performs the determined operation and modifies the measurement image to include a result of the operation.

2. The handheld measurement system of claim 1, further comprising a housing that surrounds at least a part of the handheld measurement system at an outer layer, and wherein the first and second module devices are separate from the housing.

3. The handheld measurement system of claim 1, wherein the processor generates the plurality of option images in response to selection of a maximize image input.

4. The handheld measurement system of claim 3, wherein the maximize image input is displayed on the touch screen for selection when the measurement image is displayed without the option images.

5. The handheld measurement system of claim 1, wherein the measurement image is modified to include a textual representation of the first measurement data and/or a textual representation of the second measurement data in the measurement image.

6. The handheld measurement system of claim 1, further comprising a storage device, wherein the secondary measurement data received by the communication system is automatically stored in the storage device, and wherein in response to selection of the first displayed option image, the processor retrieves the first measurement data from the storage device, and in response to selection of the second displayed option image, the processor retrieves the second measurement data from the storage device.

7. The handheld measurement system of claim 6, wherein the processor modifies the measurement image to exclude or include:
the retrieved first measurement data in response to selection of the first displayed option image, and
the retrieved second measurement data in response to selection of the second option image.

8. The handheld measurement system of claim 1, wherein the plurality of option images displayed on the touch screen is a first plurality of option images, and wherein, in response to an input to the touch screen, the processor further generates and displays on the touch screen a second plurality of option images that is different than the first plurality of option images.

9. A handheld digital multimeter comprising:
a measurement device configured to measure at least one electrical or mechanical parameter and generate measurement data from the at least one measured electrical or mechanical parameter; and
a processor in communication with the measurement device, wherein the processor is configured to:
generate a plurality of option images, wherein each option image corresponds to a particular option;
generate a display on a touch screen that simultaneously displays the measurement data and the option images, wherein the displayed option images are selectable by an input to the touch screen; and
modify the generated display in response to selection of at least one of the displayed option images,
wherein the processor is further configured to receive secondary measurement parameters including a first measured electrical or mechanical parameter from a first module device and a second measured electrical or mechanical parameter from a second module device, wherein the first and second module devices are separate from each other and separate from the measurement device,
wherein a first displayed option image corresponds to the first module device or a parameter measured by the first module device, and a second displayed option image corresponds to the second module device or a parameter measured by the second module device,
wherein the processor is configured to modify the generated display to exclude or include:
the first measured electrical or mechanical parameter in response to user selection of the first displayed option image, and
the second measured electrical or mechanical parameter in response to user selection of the second displayed option image, and
wherein the processor is further configured to generate on the touch screen a display of a third option image corresponding to an operation that is determined by the processor based on a type of measurement data in the measurement data generated by the measurement device and a type of measurement data in the first and/or second measured electrical or mechanical parameter received respectively from the first and/or second module devices, wherein, in response to selection of the third option image corresponding to the operation, the processor performs the determined operation and modifies the generated display to include a result of the operation.

10. The handheld digital multimeter of claim 9, wherein more than one displayed option image is simultaneously selectable, and in response to selection of more than one displayled option image, the generated display is modified to include or exclude secondary parameters corresponding to the selected option images.

11. A method for displaying a measurement image on a handheld device comprising:
measuring at least one parameter with a handheld measurement device, wherein the measured parameter is an electrical or mechanical parameter;
generating a measurement image that is derived from the measured parameter;
receiving one or more secondary measurement parameters from module devices that are separate from each other and separate from the handheld measurement device, wherein the secondary measurement parameters are electrical or mechanical parameters measured by the module devices;
generating a plurality of option images;
simultaneously displaying the measurement image and the plurality of option images on display screen, wherein each displayed option image corresponds to a selectable option, and wherein the plurality of option images includes an option image corresponding to each of the module devices;
receiving a selection of at least one displayed option image corresponding to a particular module device, wherein more than one option image displayed on the display screen is simultaneously selectable;
modifying the measurement image displayed on the display screen to include or exclude the secondary measurement parameter of the particular module device corresponding to the selected option image, and if more than one option image is selected, modifying the measurement image displayed on the display screen to include or exclude secondary measurement parameters of the devices corresponding to the selected option images;
determining a potential operation based on the at least one parameter measured by the handheld measurement device and the one or more secondary measurement parameters received from the module devices;
generating and displaying on the display screen an option image corresponding to the potential operation;
receiving a selection of the option image to the potential operation, and in response thereto, performing the potential operation;
modifying the measurement image to include a result of the performed operation; and
displaying the modified measurement image on the display screen.

12. The method of claim 11, wherein the display screen is a touch screen, and wherein the plurality of option images are generated in response to selection of a maximize image input displayed on the touch screen.

13. The method of claim 12, wherein the maximize image input is displayed on the touch screen for selection when the measurement image is displayed without the plurality of option images.

14. The method of claim 11, further comprising storing the one or more secondary measurement parameters received from the module devices in a data storage device, and in response to receiving a selection of at least one displayed option image corresponding to a particular module device, the method further comprises retrieving the secondary measurement parameter of the particular module device from the data storage device, and in response to more than one option image being selected, the method further comprises retrieving the secondary measurement parameters of the module devices corresponding to the selected option images.

15. The method of claim 11, wherein the plurality of option images displayed on the display screen is first plurality of option images, the method further comprising:
   receiving a selection of a particular option image in the first plurality of option images;
   in response to receiving the selection of the particular option image, generating a second plurality of option images that is different than the first plurality of option images; and
   displaying on the touch screen the second plurality of option images in place of the first plurality of option images, wherein each displayed option image in the second plurality of option images corresponds to a selectable option.

* * * * *

UNITED STATES PATENT AND TRADEMARK OFFICE
CERTIFICATE OF CORRECTION

PATENT NO. : 10,209,271 B2
APPLICATION NO. : 15/193887
DATED : February 19, 2019
INVENTOR(S) : David Lawrence Epperson et al.

Page 1 of 1

It is certified that error appears in the above-identified patent and that said Letters Patent is hereby corrected as shown below:

In the Claims

Column 10, Claim 9, Line 3:
"result ofthe operation." should read --result of the operation.--

Column 10, Claim 10, Line 7:
"displayled" should read --displayed--

Column 10, Claim 11, Line 49:
"of the option image to the potential" should read --of the option image corresponding to the potential--

Signed and Sealed this
Twenty-ninth Day of October, 2019

Andrei Iancu
*Director of the United States Patent and Trademark Office*